(12) United States Patent
Swedek et al.

(10) Patent No.: US 7,101,254 B2
(45) Date of Patent: Sep. 5, 2006

(54) SYSTEM AND METHOD FOR IN-LINE METAL PROFILE MEASUREMENT

(75) Inventors: Boguslaw A Swedek, Cupertino, CA (US); Nils Johansson, Los Gatos, CA (US); Andreas Norbert Wiswesser, Mountain View, CA (US); Manoocher Birang, Los Gatos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/966,948

(22) Filed: Oct. 15, 2004

(65) Prior Publication Data

US 2005/0048874 A1 Mar. 3, 2005

Related U.S. Application Data

(63) Continuation of application No. 10/330,685, filed on Dec. 27, 2002, now Pat. No. 6,811,466.

(60) Provisional application No. 60/343,994, filed on Dec. 28, 2001.

(51) Int. Cl.
*B24B 49/00* (2006.01)
*B24B 1/00* (2006.01)

(52) U.S. Cl. .............................. 451/5; 451/41; 451/57; 451/56; 451/286; 451/287; 451/288; 451/443; 451/444

(58) Field of Classification Search .................. 451/41, 451/57, 56, 286, 287, 288, 443, 444
See application file for complete search history.

(56) References Cited

U.S. PATENT DOCUMENTS

| | | | |
|---|---|---|---|
| 4,005,359 A | 1/1977 | Smoot | |
| 4,112,365 A | 9/1978 | Larson et al. | |
| 4,303,885 A | 12/1981 | Davis et al. | |
| 4,467,281 A | 8/1984 | Davis et al. | |
| 4,556,845 A | 12/1985 | Strope et al. | |
| 4,673,877 A | 6/1987 | Sakamoto et al. | |
| 4,715,007 A | 12/1987 | Fujita et al. | |
| 4,716,366 A | 12/1987 | Hosoe et al. | |
| 4,829,251 A | 5/1989 | Fischer | |
| 4,849,694 A | 7/1989 | Coates | |
| 4,963,500 A | 10/1990 | Cogan et al. | |
| 4,977,853 A | 12/1990 | Falcoff et al. | |
| 5,001,356 A | 3/1991 | Ichikawa | |
| 5,003,262 A | 3/1991 | Egner et al. | |
| 5,081,796 A | 1/1992 | Schultz | |
| 5,140,265 A | 8/1992 | Sakiyama et al. | |
| 5,213,655 A | 5/1993 | Leach et al. | |

(Continued)

FOREIGN PATENT DOCUMENTS

EP 0 460 348 A2 12/1991

(Continued)

*Primary Examiner*—Joseph J. Hail, III
*Assistant Examiner*—Shantese McDonald
(74) *Attorney, Agent, or Firm*—Fish & Richardson

(57) ABSTRACT

A system includes a measuring station for positioning an eddy current probe proximate to a substrate in a substrate holder. The probe can produce a time-varying magnetic field, in order to induce eddy currents in one or more conductive regions of a substrate either prior to or subsequent to polishing. The eddy current signals are detected, and may be used to update one or more polishing parameters for a chemical mechanical polishing system. The substrate holder may be located in a number places; for example, in a substrate transfer system, a factory interface module, a cleaner, or in a portion of the chemical mechanical polishing system away from the polishing stations. Additional probes may be used.

3 Claims, 3 Drawing Sheets

U.S. PATENT DOCUMENTS

| | | | |
|---|---|---|---|
| 5,237,271 A | 8/1993 | Hedengren | |
| 5,343,146 A | 8/1994 | Koch et al. | |
| 5,355,083 A | 10/1994 | George et al. | |
| 5,357,331 A | 10/1994 | Flockencier | |
| 5,413,941 A | 5/1995 | Koos et al. | |
| 5,427,878 A | 6/1995 | Corliss | |
| 5,433,651 A | 7/1995 | Lustig | |
| 5,451,863 A | 9/1995 | Freemen | |
| 5,511,005 A * | 4/1996 | Abbe et al. | 702/84 |
| 5,525,903 A | 6/1996 | Mandl et al. | |
| 5,541,510 A | 7/1996 | Danielson | |
| 5,559,428 A | 9/1996 | Li et al. | |
| 5,605,760 A | 2/1997 | Roberts | |
| 5,609,511 A | 3/1997 | Moriyama et al. | |
| 5,640,242 A | 6/1997 | O'Boyle et al. | |
| 5,644,221 A | 7/1997 | Li et al. | |
| 5,658,183 A | 8/1997 | Sandhu et al. | |
| 5,660,672 A | 8/1997 | Li et al. | |
| 5,663,797 A | 9/1997 | Sandhu | |
| 5,672,091 A | 9/1997 | Takahashi et al. | |
| RE35,703 E | 12/1997 | Koch et al. | |
| 5,708,506 A | 1/1998 | Birang | |
| 5,719,495 A | 2/1998 | Moslehi | |
| 5,730,642 A | 3/1998 | Sandhu et al. | |
| 5,731,697 A | 3/1998 | Li et al. | |
| 5,733,171 A | 3/1998 | Allen et al. | |
| 5,762,537 A | 6/1998 | Sandhu et al. | |
| 5,791,969 A | 8/1998 | Lund | |
| 5,807,165 A | 9/1998 | Uzoh et al. | |
| 5,838,447 A | 11/1998 | Hiyama et al. | |
| 5,851,135 A | 12/1998 | Sandhu et al. | |
| 5,865,666 A | 2/1999 | Nagahara | |
| 5,872,633 A | 2/1999 | Holzapfel et al. | |
| 5,889,401 A | 3/1999 | Jourdain et al. | |
| 5,893,796 A | 4/1999 | Birang et al. | |
| 5,899,792 A | 5/1999 | Yagi | |
| 5,911,619 A | 6/1999 | Uzoh et al. | |
| 5,913,713 A | 6/1999 | Cheek et al. | |
| 5,929,994 A | 7/1999 | Lee et al. | |
| 5,948,203 A * | 9/1999 | Wang | 156/345.13 |
| 5,949,927 A | 9/1999 | Tang | |
| 5,964,643 A | 10/1999 | Birang et al. | |
| 6,004,187 A | 12/1999 | Nyui et al. | |
| 6,034,781 A | 3/2000 | Sarfaty et al. | |
| 6,068,539 A | 5/2000 | Bajaj et al. | |
| 6,071,178 A | 6/2000 | Baker, III | |
| 6,120,348 A | 9/2000 | Fujita et al. | |
| 6,159,073 A | 12/2000 | Wiswesser et al. | |
| 6,179,709 B1 | 1/2001 | Redeker et al. | |
| 6,190,234 B1 | 2/2001 | Swedek et al. | |
| 6,254,459 B1 | 7/2001 | Bajaj et al. | |
| 6,280,289 B1 | 8/2001 | Wiswesser et al. | |
| 6,296,548 B1 | 10/2001 | Wiswesser et al. | |
| 6,309,276 B1 | 10/2001 | Tsai et al. | |
| 6,407,546 B1 | 6/2002 | Le et al. | |
| 6,431,949 B1 * | 8/2002 | Ishikawa et al. | 451/5 |
| 6,433,541 B1 | 8/2002 | Lehman et al. | |
| 6,448,795 B1 | 9/2002 | Ermakov et al. | |
| 6,458,014 B1 | 10/2002 | Ishikawa et al. | |
| 6,558,229 B1 | 5/2003 | Kimura et al. | |
| 6,563,308 B1 | 5/2003 | Nagano et al. | |
| 6,575,825 B1 | 6/2003 | Tolles et al. | |
| 6,586,337 B1 | 7/2003 | Parikh | |
| 6,621,264 B1 | 9/2003 | Lehman et al. | |
| 6,663,469 B1 | 12/2003 | Kimura et al. | |
| 6,707,540 B1 | 3/2004 | Lehman et al. | |
| 2001/0008827 A1 | 7/2001 | Kimura et al. | |
| 2002/0002029 A1 | 1/2002 | Kimura et al. | |
| 2002/0013124 A1 | 1/2002 | Tsujimura et al. | |
| 2002/0077031 A1 | 6/2002 | Johansson et al. | |
| 2002/0098777 A1 | 7/2002 | Laursen et al. | |
| 2002/0164925 A1 | 11/2002 | Swedek et al. | |

FOREIGN PATENT DOCUMENTS

| | | |
|---|---|---|
| EP | 0 663 265 A1 | 7/1995 |
| EP | 0 640 438 A1 | 9/1995 |
| EP | 0 738 561 A1 | 10/1996 |
| EP | 0 881 040 A2 | 12/1998 |
| EP | 0 881 484 A2 | 12/1998 |
| EP | 0 402 527 A2 | 12/2000 |
| EP | 1 116 552 A2 | 7/2001 |
| JP | 1-136009 | 5/1989 |
| JP | 3-295409 | 12/1991 |
| JP | 7-091948 | 4/1995 |
| WO | 01/46684 | 6/2001 |
| WO | 01/89765 | 11/2001 |

* cited by examiner

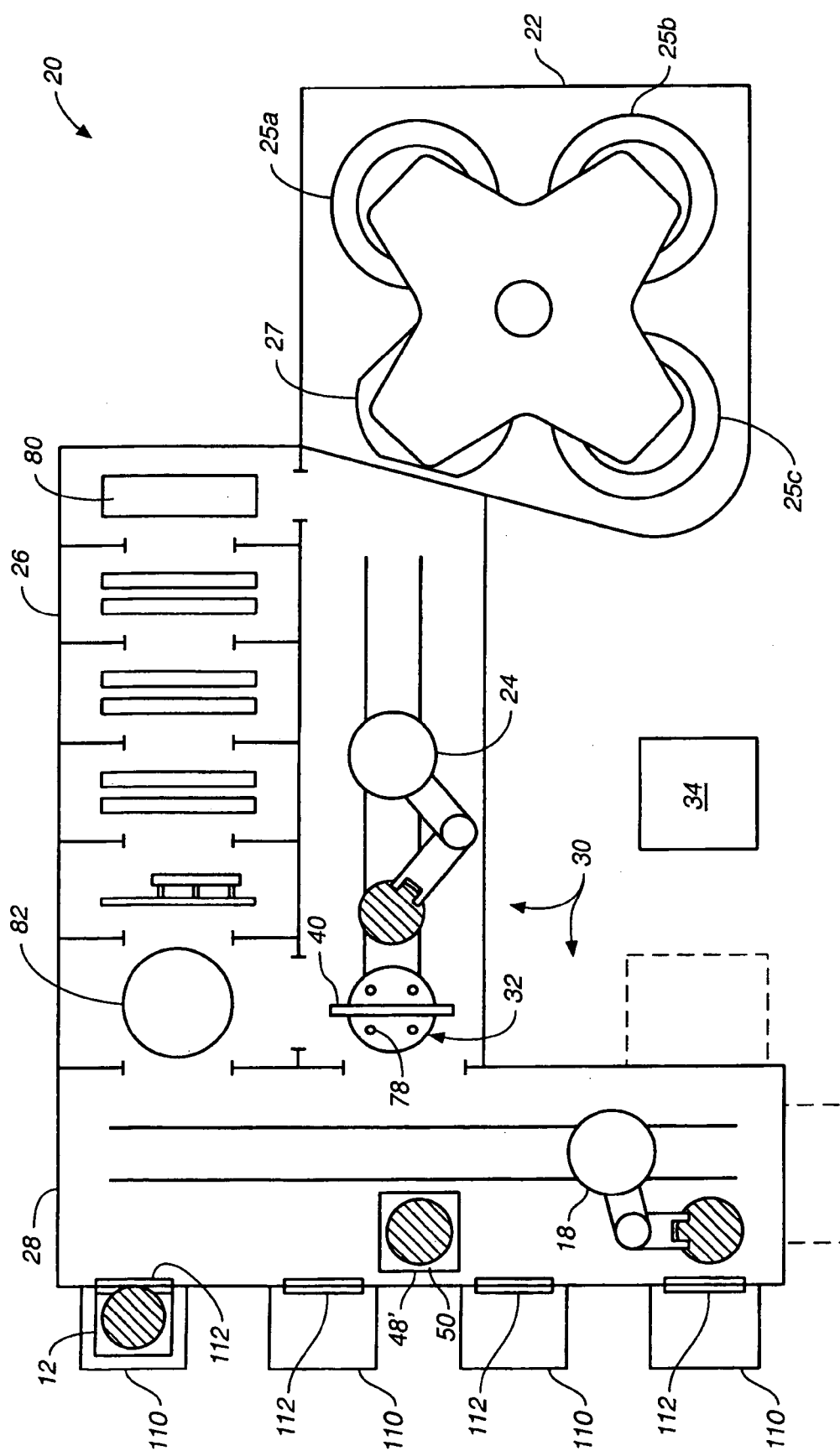
FIG._1

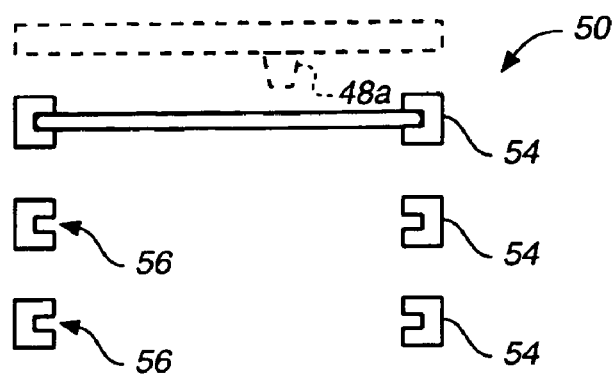
FIG._2
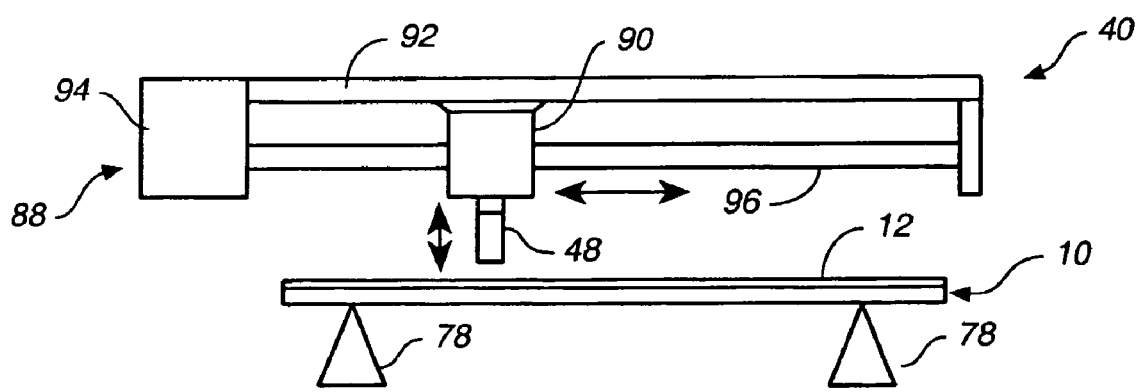
FIG._3

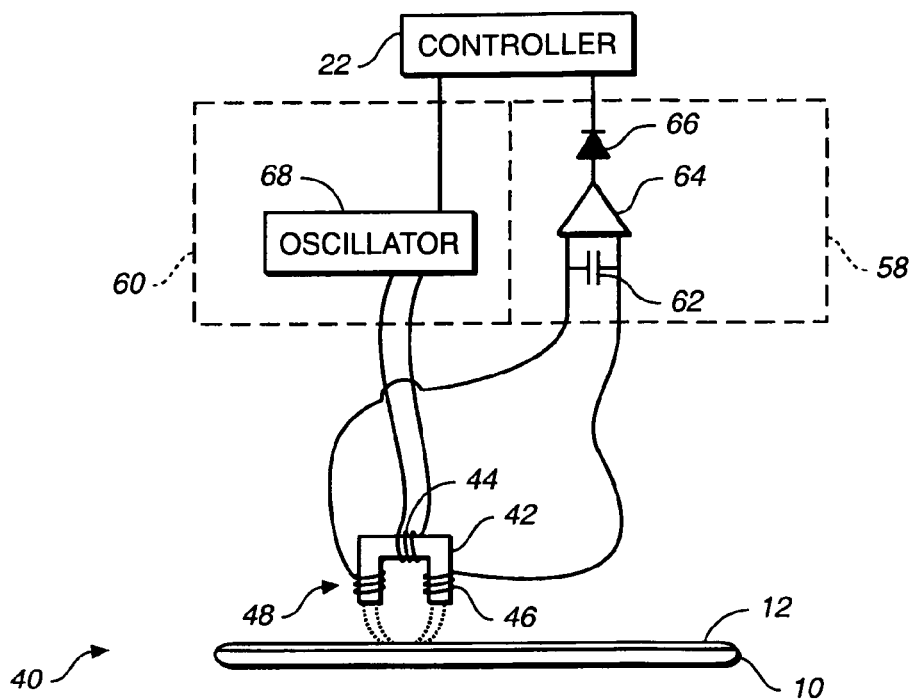
FIG._4
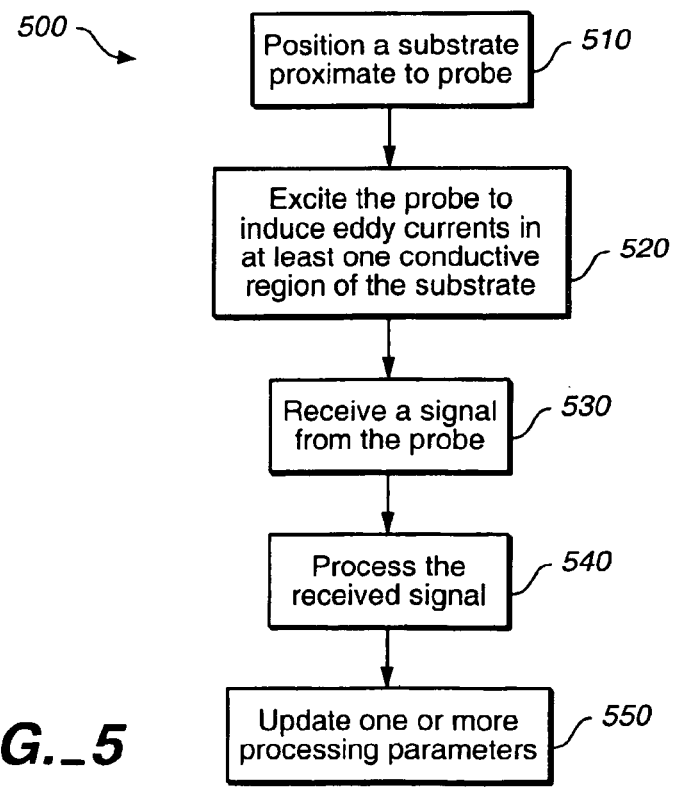
FIG._5

SYSTEM AND METHOD FOR IN-LINE METAL PROFILE MEASUREMENT

CROSS-REFERENCE TO RELATED APPLICATIONS

This application is a continuation of U.S. patent application Ser. No. 10/330,685, filed Dec. 27, 2002, now U.S. Pat. No. 6,811,466, which claims priority to U.S. Provisional Application Ser. No. 60/343,994, filed on Dec. 28, 2001, which are incorporated by reference herein.

BACKGROUND

The present disclosure relates generally to metrology for chemical mechanical polishing, and more particularly to systems and methods for eddy current metrology.

An integrated circuit is typically formed on a substrate by the sequential deposition of conductive, semiconductive or insulative layers on a silicon wafer. One fabrication step involves depositing a filler layer over a non-planar surface, and planarizing the filler layer until the non-planar surface is exposed. For example, a conductive filler layer can be deposited on a patterned insulative layer to fill the trenches or holes in the insulative layer. The filler layer is then polished until the raised pattern of the insulative layer is exposed. After planarization, the portions of the conductive layer remaining between the raised pattern of the insulative layer form vias, plugs and lines that provide conductive paths between thin film circuits on the substrate. In addition, planarization is generally needed to planarize the substrate surface for photolithography.

Chemical mechanical polishing (CMP) is one accepted method of planarization. Conventionally, this planarization method involves holding a substrate on with a carrier head and placing the substrate against a rotating polishing pad. The carrier head provides a controllable load on the substrate to push it against the polishing pad. The polishing pad can be either a "standard" pad or a fixed-abrasive pad. A standard pad has a durable roughened surface, whereas a fixed-abrasive pad has abrasive particles held in a containment media. A polishing solution, including at least one chemically-reactive agent, and abrasive particles if a standard pad is used, is supplied to the surface of the polishing pad (also, some processes use "abrasiveless" polishing).

One problem in CMP is determining whether the polishing process is complete, i.e., whether a substrate layer has been planarized to a desired flatness or thickness, or when a desired amount of material has been removed, or whether an underlying layer has been exposed. Overpolishing (removing too much) of a conductive layer or film leads to increased circuit resistance. On the other hand, underpolishing (removing too little) of a conductive layer leads to electrical shorting. Variations in the initial thickness of the substrate layer, the slurry composition, the polishing pad condition, the relative speed between the polishing pad and the substrate, and the load on the substrate can cause variations in the material removal rate. These variations cause variations in the time needed to reach the polishing endpoint. Therefore, the polishing endpoint cannot be determined merely as a function of polishing time.

Two techniques are used to compensate for variations in the polishing endpoint. In-line metrology systems measure the thickness of layers on the substrate before and after processing. Assuming the layer thickness is determined prior to polishing, the polishing time can be adjusted to provide more accurate control of the amount of material remaining on the substrate after polishing. In-situ systems monitor the substrate during polishing to measure the amount of material removed or to detect sudden changes in substrate characteristics that indicate that a layer has been exposed.

A recent in-situ endpoint detection technique induces an eddy current in a metal layer on the substrate and uses an eddy current sensor to monitor the change in the eddy current as the metal layer is removed.

SUMMARY

An in-line eddy current monitoring system generates a signal related to the thickness of a conductive region such as a conductive layer on a wafer. The in-line eddy current monitoring system may be used either prior to or subsequent to polishing the wafer using a chemical mechanical polishing system.

In general, in one aspect, the invention is directed to a system that includes a polishing apparatus having one or more polishing stations for polishing of a substrate, a substrate transfer system to transfer a substrate to and from the polishing stations, a substrate holder accessible by the substrate transfer system to hold the substrate at a location away from the polishing stations, an eddy current monitoring system having a probe positionable proximate to the substrate in the substrate holder to induce eddy currents in a conductive region of the substrate and generate a signal associated with a thickness of the conductive region, and a controller to receive the signal from the probe. The polishing stations operate with a plurality of polishing parameters, and the controller controls at least one of the plurality of polishing parameters in response to the signal.

Implementations of the invention may include one or more of the following features. The substrate transfer system may include a wet robot, and the substrate holder may be located along a path of the wet robot. The system may include a factory interface module with at least one port to receive the substrate from a cassette, and the substrate holder may be located in the factory interface module. The transfer mechanism may include a factory interface robot to transfer the substrate to and from the factory interface module. The eddy current monitoring system may include a translation mechanism to move the probe across a surface of the substrate, e.g., along a diameter of the substrate. The translation mechanism may include a rotation mechanism to rotate the substrate with respect to the probe. The translation mechanism may include a first translation to move the probe along a first direction across the surface of the substrate and a second mechanism to move the probe along a second direction different from the first direction. The system may include a cleaner, and the substrate holder may be located in the cleaner. The substrate holder may be located in the polishing apparatus. The system may include another substrate holder to hold the substrate at another location away from the polishing stations, another probe positionable proximate to the substrate in the another substrate holder to induce eddy currents in a conductive region of the substrate and generate another signal associated with a thickness of the conductive region, and the controller may control at least one polishing parameter of the chemical mechanical polisher based on the another signal from the another probe. The controller may be configured to cause the substrate transfer system to place the substrate in the substrate holder prior to or after placing the substrate in the polishing station.

In another aspect, the invention is directed to a system that includes a cleaner to receive polished substrates from a polishing apparatus and an eddy current monitoring system.

The cleaner has a substrate holder, and the eddy current monitoring system has a probe positionable proximate to the substrate in the substrate holder to induce eddy currents in a conductive region of the substrate and generate signals associated with a thickness of the conductive region.

In another aspect, the invention is directed to a system that includes a factory interface module to receive substrates and an eddy current monitoring system. The factory interface module has a substrate holder, and the eddy current monitoring system has a probe positionable proximate to the substrate in the substrate holder to induce eddy currents in a conductive region of the substrate and generate signals associated with a thickness of the conductive region.

Implementations of the above inventions may include one or more of the following features. The system may include a controller to modify at least one polishing parameter of the polishing apparatus based on the signal from the probe.

In another aspect, the invention is directed to a chemical mechanical polishing system that has one or more carrier heads for holding a substrate during polishing, one or more polishing stations, a substrate holding station separate from the polishing stations, and an eddy current monitoring system having a probe, the probe to be positioned proximate to the substrate in the substrate holding station to induce eddy currents in a conductive region of the substrate and generate signals associated with a thickness of the conductive region.

Implementations of the above inventions may include one or more of the following features. The system may include a controller to modify at least one polishing parameter of the polishing apparatus based on the signal from the probe.

In another aspect, the invention is directed to a system that includes a measuring station to hold a substrate, an eddy current metrology system, and a controller. The measuring station is positioned at a location away from a polishing pad of a chemical mechanical polishing apparatus. The eddy current metrology system has a probe to be placed in proximity to a conductive region of the substrate at the measuring station, a driver unit to excite the probe, and a sensor unit to generate an output signal associated with a thickness of the conductive region. The controller is configured to adjust one or more polishing endpoint criteria based on the output signal from the eddy current metrology system.

Implementations of the above inventions may include one or more of the following features. The location may be chosen from the group consisting of in the chemical mechanical polishing apparatus, in a substrate transfer system, in a cleaner, and in a factory interface module.

In another aspect, the invention is directed to a method in which a substrate is transported with a substrate transferring system to a measuring station located separate from a polishing station of a polishing apparatus, a probe of an eddy current system is positioned in proximity to the substrate at the measuring station, the probe is excited to induce eddy currents in a conductive region of the substrate, measurement signals are generated with the eddy current system associated with a thickness of the conductive region, and a polishing parameter of the polishing apparatus is controlled based on the signals from the eddy current system.

Implementations of the above inventions may include one or more of the following features. The substrate may be polished. The polishing step may occur prior to the transporting step so that the polishing parameter controls polishing of a subsequent substrate, or the polishing step may occur after the transporting step so that the polishing parameter controls polishing of the substrate.

In another aspect, the invention is directed to an article comprising a machine-readable medium storing instructions operable to cause one or more machines to perform the above methods.

The details of one or more implementations of the invention are set forth in the accompanying drawings and the description below. Other features and advantages of the invention will be apparent from the description and drawings, and from the claims.

DESCRIPTION OF DRAWINGS

FIG. 1 illustrates a chemical mechanical polishing and cleaning system that includes an in-line eddy current metrology station.

FIG. 2 illustrates a temporary storage station in the polishing and cleaning system.

FIG. 3 illustrates an in-line eddy current metrology system.

FIG. 4 illustrates the electronic components of the in-line eddy current metrology system of FIG. 2.

FIG. 5 is a flow chart showing process steps for using an in-line eddy current metrology system with a chemical mechanical polishing system.

Like reference symbols in the various drawings indicate like elements.

DETAILED DESCRIPTION

Although in-line metrology systems can provide accurate monitoring of layer thickness at specific locations on a substrate, some in-line metrology systems, such as profilometers, involve undesirable contact of the measuring device with the substrate. In addition, some non-contact metrology systems that use optical techniques, such as interferometers, are not suitable for opaque metal layers.

A substrate processing system 20 is depicted in FIG. 1. A description of a similar substrate processing system can be found in U.S. patent application Ser. No. 09/543,858, the entire disclosure of which is incorporated herein by reference. The substrate processing system 20 includes a chemical mechanical polisher 22, a cleaner 26, a factory interface module 28, an in-line eddy current metrology system 40, and a substrate transfer system 30. The substrate transfer system 30 includes a factory interface robot 18 to move substrates from the cassettes to a holding station 32 or from the output of the cleaner 26 back to the cassettes, and a wet robot 24 to move substrates between the holding station 32, the polisher 22, and the input of the cleaner 26. The holding station 32 can include a substrate-pass through support 78. The operations of the substrate processing system 20 can be coordinated by controller 34, which can include one or more programmable digital computers executing centralized or distributed control software.

The factory interface module 28 includes a plurality (e.g., four) of cassette support plates 110 to accept the wafer cassettes 12, and a similar plurality of cassette ports 112 to permit wafer transport from the cassettes 12 into the factory interface module 28. Referring to FIGS. 1 and 2, optionally, the factory interface module 28 can include one or more substrate holders such as a temporary storage station 50. For example, the storage station 50 can include a one or more supports 54 that define a one more slots 56. A substrate 10 is held in the slot 56 in a substantially horizontal position. From this location, the factory interface robot 34 is able to transport the substrate to the holding station 32 or to a cassettes 12.

Returning to FIG. 1, the polisher 22 can be a Mirra® chemical mechanical polisher manufactured by Applied Materials, Inc. of Santa Clara, Calif. A description of such a polisher can be found in U.S. Pat. No. 5,738,574, the entire disclosure of which is incorporated herein by reference. Polisher 22 includes three polishing stations 25a, 25b, 25c, and a transfer station 27.

The cleaner 26 can include a multi-stage system for cleaning and drying the substrates, such as a megasonic cleaner stage, two scrub-brush stages, and a spin-rinse drier stage. The input end of the cleaner can include a temporary storage station 80, and output end of the cleaner also have a temporary storage station 82. The input storage station 80 can have an indexable buffer to hold one or more substrates in a vertical orientation before cleaning. The output storage station can have an indexible buffer, or it can hold the substrates horizontally, prior to the substrates being picked and returned to the cassettes. Substrates could also be transferred from the cassette to the input storage station 80, and then handed off to the wet robot 18 at the holding station 32 by an unillustrated loading robot.

The in-line eddy current metrology system 40 can be located at the holding station 32, although a different suitable location for the in-line eddy current metrology system 40 may be used. The in-line eddy current metrology system 40 is used to measure the thickness of a conductive layer on the substrate 10 before or after polishing of the substrate by the polisher 22.

Referring to FIG. 3, in one implementation, a substrate 10 is held at the holding station in a generally substantially horizontal position by support structure 78, such as a support ring that contacts the edge of the substrate or a plurality support pins that contact the bottom of the substrate.

The in-line eddy current monitoring system 40 includes an eddy current sensor 48 and a translation mechanism 88 to move the sensor 48 laterally in order to scan across the substrate 10. The translation mechanism 88 can be fixedly attached to the frame of the polishing and cleaning system 20 and can be capable of extending and retracting horizontally along a path that carries the sensor 48 across the surface of the substrate 10. For example, the sensor 48 can be secured to a slider 90 that is slidable along support rails 92. A motor 94 can rotate a threaded drive shaft 96 that passes through a threaded bore in the slider 90. Thus, each rotation of the drive shaft 96 translates the sensor 48 by a preset horizontal distance. The support rails 92 can be located so that when the substrate is supported on the support structure 78, the sensor 48 scans along a diameter of the substrate (i.e., through the center of the substrate). The translation mechanism 88 can also include a vertical actuator that can move the sensor 48 vertically in order to adjust the distance between the sensor 48 and the substrate 10. Optionally, a rotary actuator can be connected to the support structure 78 in order to rotate substrate 10 about its vertical axis.

Of course, many other sorts of mechanisms can be used to move the sensor relative to the surface of the substrate. For example, the in-line eddy current monitoring system 40 could use a mechanism that translates the sensor 48 along both the x-axis and the y-axis, or it could use an articulated arm capable of rotation about multiple axes. In general, any device capable of supporting and precisely moving and locating the eddy current sensor 48 can be used. In addition, in another implementation, the sensor 48 can remain stationary, and the substrate is moved by the support structure 78. For example, the substrate could be held by the wet robot 18, and the wet robot 18 could move the substrate in a preset path past the sensor 48. The wet robot 18 can hold the substrate 10 with a vacuum chuck or an edge gripper, and can be capable of extending and retracting horizontally and vertically, as well as rotating about a vertical axis. Also, although FIG. 3 shows the sensor 48 on the same side of the substrate as the conductive layer 12, the probe 48 can be positioned beneath the substrate or the substrate could be held up-side down to allow for scanning of the conductive layer 12 from the substrate backside. Furthermore, more than one eddy current sensor 48 can be placed in proximity to the conductive layer 12. In addition, the substrate could be held vertically rather than horizontally.

Different implementations may monitor different regions of a substrate. In FIG. 3, sensor 48 translates across substrate 10, which remains stationary on support structure 78. In this implementation, conductive regions that generally lie along the line of traverse of the sensor are monitored. In another implementation, support structure 78 may rotate substrate 10 as sensor 48 traverses across substrate 10. In this and equivalent implementations, substantially all conductive regions on substrate 10 may be monitored. In another implementation, a more limited region of substrate 10 may be monitored. For example, sensor 48 could be moved across a single die on substrate 10 using translation and/or rotation of sensor 48 and/or substrate 10.

Referring to FIG. 4, in a simple implementation, the eddy current sensor 48 includes a core 42, a drive coil 44 wound around one part of core 42, and a sense coil 46 wound around second part of core 42. A driver system 60 and a sense system 58 are coupled to the sensor 48 and to a controller 22, which can be part of controller 34. The basic elements of the drive system 60 include an oscillator 68 connected to the drive coil 44, and the basic elements of the sense system 58 include a capacitor 62 connected in parallel with the sense coil 46, an RF amplifier 64 connected to the sense coil 46, and a diode 66. Of course, the implementing electronics can be different; for example, considerably more complex electronics may be used for signal amplification and filtering in order to improve the signal to noise ratio of the sensed signal. The oscillator 68, capacitor 62, RF amplifier 64, and diode 66 can be located apart from the sensor 48, or they can be coupled to and move with the sensor 48. Further discussion of eddy-current sensing can be found in U.S. patent application Ser. No. 09/847,867, filed May 2, 2001, the entire disclosure of which is incorporated by reference.

The driver system 60 excites the sensor 48 with an alternating current that creates an oscillating magnetic field that induces eddy currents in the conductive layer 12. The eddy currents cause the conductive layer 12 to act as an impedance source in parallel with the sense coil 46 and capacitor 62. The thickness of the conductive layer 12 determines its impedance and the degree of coupling (and thus the Q-factor) to the sensor 48. The sense system 58 generates a signal based on the amplitude, frequency or phase shift of the oscillating magnetic field, thereby providing an indication of the thickness of the conductive layer 12.

The controller 22 can be a digital computer connected to the drive system 60, the sense system 58, and the translation mechanism 88. The controller 22 may be programmed to position the sensor 48 adjacent to the substrate 10, to activate the drive system 60, to move the sensor 48 across the diameter of the substrate 10, to store the signals received from the sense system 58, and to determine the thickness of the conductive layer 12 at different points on the substrate from the signals. In addition, the controller 22 may be programmed to adjust the polishing process of the polisher 20 based on the measured thickness, or the controller 22 may feed data to the controller 34 to perform this function. The polishing process of polisher 20 may be adjusted by modifying, for example, the polishing time, slurry composition, the relative speed between the polishing pad and the substrate, the slurry drop off position, the retaining ring, the pad conditioner, the pad conditioner downforce, and/or a pressure profile of one or more carrier heads. A single controller may be used to perform functions related to controlling eddy current sensing system 40 and other portions of substrate processing system 20.

In operation, the thickness of the conductive layer 12 of the substrate 10 can be measured prior to polishing of the substrate 10. The controller 22 receives the signals from the sense system 58 associated with the thickness of the conductive layer 12, and uses the data to adjust the polishing parameters or the polishing endpoint algorithm of the polisher 20. Alternatively or in addition, the thickness of the conductive layer 12 of the substrate 10 can be measured after polishing of the substrate 10, and the controller 22 can use the signal to adjust the polishing parameter or endpoint algorithm for subsequent substrates.

Referring to FIG. 5, a method 500 for monitoring the thickness of a conductive region on a layer includes the following. A substrate is positioned proximate to a probe of an eddy current monitoring system (510). A time-dependent current is provided to a drive coil of the probe to excite the probe and thereby induce eddy currents in the conductive region (520). A signal is received using the sense coil of the probe (530), and is then processed (540). The processed signal may be used to update one or more processing parameters (550), or in other ways (e.g., to determine the thickness of the conductive region).

Eddy current monitoring system 40 can be located proximate to a measuring station, where the substrate is held in a substrate holder at the measuring station either prior to or subsequent to polishing the substrate. Referring again to FIG. 1, the in-line eddy current monitoring system 40 can be located at a substrate holder such as holding station 32 in the area of the wet robot 24. This location is advantageous if a substrate is scanned after polishing, because it is located close to the polisher and little time elapses before the measurement is performed. In an implementation where an eddy current measurement is used to modify one or more processing parameters for polishing a subsequent substrate, this location allows for more rapid feedback to the polisher 22. The location is also functional if a substrate is scanned prior to polishing.

Another possible location for the in-line eddy current monitoring system 40 is at a support station located in the factory interface module 28. Locating an eddy current monitoring system in factory interface module 28 may be convenient when measuring a conductive layer 12 prior to polishing. For example, the monitoring system 40 can be in the storage station 50 of the factory interface module 28 adjacent the nests 56 where the substrates 10 are held by the slots 54. For example, each nest 56 may be equipped with a sensor 48*a* (shown in phantom) that measures the thickness of the conductive layer 12 while the substrate 10 is being held in the nest. The sensor 48*a* could be movable, or it could be stationary and sense the layer thickness as the substrate is being inserted or removed from the nest. Another possible location for the in-line eddy current monitoring system 40 include the input storage station 80 and output storage station 82 in the cleaner 26. Eddy current monitoring system 40 may be located proximate to transfer station 27 of polisher 20, or at another location in polisher 20 where the thickness of a conductive region may be measured prior to and/or subsequent to polishing the substrate rather than during polishing.

In some implementations, a second eddy current monitoring system 40' may be included at a second location in system 40. For example, system 40 may be located at holding station 32, and may be used to measure the thickness of one or more conductive regions on a substrate subsequent to polishing. An additional system 40' may be located in factory interface module 28, and may be used to measure the thickness of one or more conductive regions on a substrate prior to polishing. The two measurements may be compared. System 40 and additional system 40' may share some elements, such as a controller 22, and/or part or all of drive system 60.

The in-line eddy current metrology system 40 has several potential advantages. The system 40 provides a non-contact measurement technique that is suitable for opaque metal layers. The sensor can move more slowly across the substrate than in an in-situ monitoring process, and consequently the sensor can be capable of a high spatial resolution. For example, a scanning resolution of one data point per millimeter is possible. In fact, the information is comparable to a standard four-point probe (4PP) substrate conductive layer measuring system. Nonetheless, the sensor can move sufficiently quickly across the substrate that throughput of the polisher is not affected. For example, the sensor can scan across the diameter of a 200 mm substrate in less than one second. The system can be simple, robust and inexpensive. The system can be positioned in an existing part of the polishing system, and consequently does not require a change to the layout of the polishing system or an increase in the footprint. The collected thickness data can be used to adjust the polishing process of the substrate being measured, or the polishing process of one or more subsequent substrates.

A number of implementations have been described. Nevertheless, it will be understood that various modifications may be made without departing from the spirit and scope of the invention. Accordingly, other implementations are within the scope of the following claims.

What is claimed is:

1. A chemical mechanical polishing system comprising:
an interface module configured to receive cassettes of pre-processed substrates, the pre-processed substrates each including a conductive layer having an associated initial thickness;
an eddy current monitoring system positioned in the interface module to generate information indicative of at least one of the initial thickness and a processed thickness of the conductive layer on a specified pre-processed substrate;
a polishing module configured to receive information indicative of one or more polishing parameters for the specified substrate, wherein the polishing parameters are based on the at least one of an initial thickness and a processed thickness of the conductive layer on the specified pre-processed substrate, the polishing module further configured to polish the specified substrate according to the polishing parameters;
a cleaner; and
a substrate transfer system configured to transfer the pre-processed substrates from a cassette to the eddy current monitoring system, the substrate transfer system father configured to transfer the pre-processed substrates from the eddy current monitoring system to the polishing module.

2. The system of claim 1, wherein the eddy current monitoring system is configured to position the specific substrate substantially horizontally.

3. The system of claim 1, wherein the system is configured to receive a first cassette including the specified substrate, and further configured to subsequently determine the at least one of the initial thickness and a processed thickness of the conductive layer on the specified pre-processed substrate, to measure the at least one of an initial thickness and a processed thickness, to polish the specified substrate according to the polishing parameters, and to clean the specified substrate prior to placing the specified substrate in the first cassette or a different cassette to be transferred away from the system.

* * * * *